(12) United States Patent
Kang

(10) Patent No.: US 7,002,862 B2
(45) Date of Patent: Feb. 21, 2006

(54) SEMICONDUCTOR MEMORY DEVICE WITH SENSE AMPLIFIER DRIVER HAVING MULTIPLIED OUTPUT LINES

(75) Inventor: Sang-Hee Kang, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 0 days.

(21) Appl. No.: 10/737,410

(22) Filed: Dec. 16, 2003

(65) Prior Publication Data

US 2004/0240291 A1    Dec. 2, 2004

(30) Foreign Application Priority Data

May 30, 2003    (KR) ................ 10-2003-0034889

(51) Int. Cl.
*G11C 7/00* (2006.01)
(52) U.S. Cl. .............. 365/205; 365/207; 365/196
(58) Field of Classification Search ........... 365/205, 365/203, 196, 189.11, 230.06
See application file for complete search history.

(56) References Cited

U.S. PATENT DOCUMENTS

| | | | |
|---|---|---|---|
| 5,511,031 A | 4/1996 | Grover et al. | |
| 5,646,880 A | 7/1997 | Yuh | |
| 5,768,201 A * | 6/1998 | Oh .............................. | 365/205 |
| 5,903,575 A | 5/1999 | Kikuda | |
| 6,310,817 B1 | 10/2001 | Kablanian | |
| 6,661,714 B1 * | 12/2003 | Lee ........................ | 365/189.11 |
| 2003/0072201 A1 | 4/2003 | Inaba | |
| 2003/0132457 A1 | 7/2003 | Lee et al. | |
| 2003/0151085 A1 | 8/2003 | Kuroki | |

FOREIGN PATENT DOCUMENTS

| | | |
|---|---|---|
| JP | 05-109265 | 4/1993 |
| JP | 10-199241 | 7/1998 |
| JP | 2003-123471 | 4/2003 |
| JP | 2003-141876 | 5/2003 |
| KR | 1020030002755 | 1/2003 |

* cited by examiner

*Primary Examiner*—Thong Q. Le
(74) *Attorney, Agent, or Firm*—Blakely Sokoloff Taylor & Zafman

(57) ABSTRACT

A semiconductor memory device is capable of enhancing a sensing speed at a central region of a bit-line sense amplifier array by multiplying output lines of a sense amplifier driver. For the purpose, the semiconductor memory device includes a sense amplifier array unit including a plurality of bit-line sense amplifiers arrayed to each other, a first driver, located at one side of the sense amplifier array unit, for generating a driving voltage of the plurality of bit-line sense amplifiers, a second driver, located at the other side of the sense amplifier array unit, for producing the driving voltage of the plurality of bit-line sense amplifiers, a first power line, which is connected between an output node of the first driver and that of the second driver, and to which a driving voltage input node of each of the plurality of bit-line sense amplifiers is attached in parallel, and a second power line, connected to the first power line in parallel between the output node of the first driver and that of the second driver, and strapped with the first power line at least one point.

14 Claims, 12 Drawing Sheets

SEMICONDUCTOR MEMORY DEVICE WITH SENSE AMPLIFIER DRIVER HAVING MULTIPLIED OUTPUT LINES

FIELD OF THE INVENTION

The present invention relates to a semiconductor memory device; and, more particularly, to a semiconductor memory device for enhancing its sensing speed and improving operational performance by multiplying output lines of a sense amplifier driver.

DESCRIPTION OF RELATED ART

In general, a dynamic random access memory (DRAM) employs a bit-line sense amplifier to amplify a voltage level of a bit-line connected to a memory cell.

As a memory device becomes large-scaled, in order to accomplish a high-speed operation, there is employed a technology by which a bit-line is connected to a sense amplifier of a latch type and a driving voltage provided from a sense amplifier driver is supplied onto driving voltage nodes RTO and SB of an arrayed plural number of bit-line sense amplifiers.

FIG. 1 is a block diagram showing an arrangement of sense amplifier drivers and bit-line sense amplifiers, and output lines of a conventional memory device.

Referring to FIG. 1, the sense amplifier driver 100 generates a VINT voltage and a VSS voltage to drive bit-lines based on control signals SAP1, SAP2, SAN and BLEQ and provides the VINT voltage and the VSS voltage to an RTO line and an SB line, respectively.

Furthermore, the arrayed plural number of bit-line sense amplifiers 101 are connected to the RTO line and the SB line in parallel and coupled with the VINT voltage and the VSS voltage.

Although there is not shown in FIG. 1, the bit-line sense amplifier 101 is connected to a positive bit-line and a negative bit-line to amplify a delicate data stored at a memory cell. In FIG. 1, there are not shown the memory cell, the positive bit-line and the negative bit-line.

According to the conventional method of driving the bit-line sense amplifier 101 in FIG. 1, the sense amplifier driver 100 and a plurality of bit-line sense amplifiers 101 located between two sense amplifier drivers are driven by using one pair of output lines of the sense amplifier driver 100, i.e., RTO line and SB line, as a pull-up source and a pull-down source, respectively.

Herein, the SAP1 signal, the SAP2 signal, the SAN signal and the BLEQ signal inputted to the sense amplifier driver 100 are control signals for controlling the bit-line sense amplifiers. This will be described in detail with reference to FIG. 6.

FIG. 2 shows an electric current flow when driving the conventional sense amplifier driver shown in FIG. 1. In FIG. 2, there are depicted two sense amplifier drivers 100A and 100B and N numbers of bit-line sense amplifiers 101 arranged between two sense amplifier drivers 100A and 100B.

In FIG. 2, since the RTO line is used as a pull-up source, an electric current provided to the bit-line sense amplifiers 101 from the sense amplifier driver 100A located at a left side is represented as $I_{RTL}$(RTO Left). On the other hand, an electric current provided to the bit-line sense amplifiers 101 from the sense amplifier driver 100B located at a right side is represented as $I_{RTR}$(RTO Right). Further, an electric current provided to each of the bit-line sense amplifiers 101 through the RTO line is represented as $I_{R1}, I_{R2}, I_{Ri}, \ldots, I_{RN-1}, I_{RN}$.

Meanwhile, since the SB line is used as a pull-down source, an electric current supplied to the sense amplifier driver 100A is represented as $I_{STL}$(S Left) and an electric current provided to the sense amplifier driver 100B is represented as $I_{STR}$(S Right). An electric current outputted from each of the bit-line sense amplifiers 101 is represented as $I_{S1}, I_{S2}, I_{Si}, \ldots, I_{SN-1}, I_{SN}$.

Referring to FIG. 2, as farther from the sense amplifier driver, the performance of driving the bit-line sense amplifier is deteriorated.

Therefore, a bit-line sense amplifier located at a central region between the sense amplifier driver 100A and the sense amplifier driver 100B has the lowest driving performance, resulting in a time delay and a decreased operating speed.

A block AA in FIG. 2 is utilized for the load modeling described in FIG. 3.

FIG. 3 shows the load modeling result of the block AA in FIG. 2. All loads occurring at a path from the sense amplifier driver 100 to a memory cell are represented with resistors and capacitors through the modeling as shown in FIG. 3.

Referring to FIG. 3, a time delay TD to a load, $C_{Ri}$ or $C_{Si}$, farthest away from the sense amplifier 100A is calculated as follows:

$$TD(C_i) = (R_1 + R_2 + \ldots R_i)C_1 + (R_2 + R_3 + \ldots R_i)C_2 + (R_3 + R_4 + \ldots R_i)C_3 + \ldots R_i C_i$$

As can be seen from the above equation, a problem occurring when driving a plurality of bit-line sense amplifiers by using one pair of RTO line and SB line in the conventional memory device is due to a layout feature of the bit-line sense amplifier array.

In the DRAM, since there are located lots of sense amplifiers and metal lines at a narrow width in the bit-line sense amplifier array region, it is not easy to secure the RTO and SB lines having a sufficient width and all the more number of bit-line sense amplifiers is required as the device is getting large-scaled.

As a result, there occurred the above defect when using the conventional structure of the sense amplifier drivers and bit-line sense amplifiers, and this will be more serious as the device is getting large-scaled.

SUMMARY OF THE INVENTION

It is, therefore, an object of the present invention to provide a semiconductor memory device having an enhanced driving force to drive bit-line sense amplifiers located at vulnerable area among an arrayed plural number of bit-line sense amplifiers by employing multiplied RTO line and SB line which are output lines of a sense amplifier driver.

In accordance with an aspect of the present invention, there is provided a semiconductor memory device comprising: a sense amplifier array unit including a plurality of bit-line sense amplifiers arrayed to each other; a first driver, located at one side of the sense amplifier array unit, for generating a driving voltage of the plurality of bit-line sense amplifiers; a second driver, located at the other side of the sense amplifier array unit, for producing the driving voltage of the plurality of bit-line sense amplifiers; a first power line, which is connected between an output node of the first driver and that of the second driver, and to which a driving voltage input node of each of the plurality of bit-line sense amplifiers is attached in parallel; and a second power line, connected to the first power line in parallel between the output node of the first driver and that of the second driver, and strapped with the first power line at least one point.

In accordance with another aspect of the present invention, there is provided a semiconductor memory device comprising: a sense amplifier array unit including a plurality of bit-line sense amplifiers arrayed to each other, wherein each bit-line sense amplifier has a first driving voltage input node being a pull-up source and a second driving voltage input node being a pull-down source of bit-lines; a first driver, located at one side of the sense amplifier array unit, for generating a first and a second driving voltage of the plurality of bit-line sense amplifiers; a second driver, located at the other side of the sense amplifier array unit, for producing the first and the second driving voltages of the plurality of bit-line sense amplifiers; a third driver, located at one side of a memory cell block, for generating the first and the second driving voltages of the plurality of bit-line sense amplifiers; a fourth driver, located at the other side of the memory cell block, for producing the first and the second driving voltages of the plurality of bit-line sense amplifiers; a first power line, which is connected between a first driving voltage output node of the first driver and that of the second driver, and to which a first driving voltage input node of each of the plurality of bit-line sense amplifiers is attached in parallel; a second power line, connected to the first power line in parallel between a first driving voltage output node of the third driver and that of the fourth driver, and strapped with the first power line at least one point; a third power line, which is connected between a second driving voltage output node of the first driver and that of the second driver, and to which a second driving voltage input node of said each of the plurality of bit-line sense amplifiers is attached in parallel; and a fourth power line, connected to the third power line in parallel between a second driving voltage output node of the third driver and that of the fourth driver, and strapped with the third power line at least one point.

In order to overcome the conventional problem, the present invention employs a method of drawing out separate power lines from a sense amplifier driver in addition to the existing RTO and SB lines and directly connecting the separate power lines with RTO lines and SB lines of sense amplifiers at vulnerable area where the sense amplifier driving force is weakest.

Furthermore, in accordance with the present invention, there is used a method of employing additional main sense amplifier drivers at left and right edges of one bank or a memory block in addition to the conventional sense amplifier drivers and directly connecting output lines of the main sense amplifier drivers with RTO lines and SB lines of sense amplifiers at vulnerable area where the sense amplifier driving force is weakest.

In accordance with the present invention, in case of multiplying the output lines of the sense amplifier, when the bit-line sense amplifier array operates, it is possible to solve the conventional problem since there are secured paths capable of directly providing an electric current to bit-line sense amplifiers having relatively weaker driving force compared to bit-line sense amplifier close to the sense amplifier driver.

That is, in the present invention, there are employed additional power lines not directly connected to the bit-line sense amplifiers and the driving force is enhanced by connecting the additional metal power lines with the existing RTO and SB lines (called as RTO strapping or SB strapping).

Although there is shown a structure of strapping both of the RTO line and the SB line in accordance with an embodiment of the present invention, it is possible to implement a structure of strapping only one of the RTO line and the SB line.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, preferred embodiments of the present invention will be described in detail with reference to the accompanying drawings.

Figure 4:
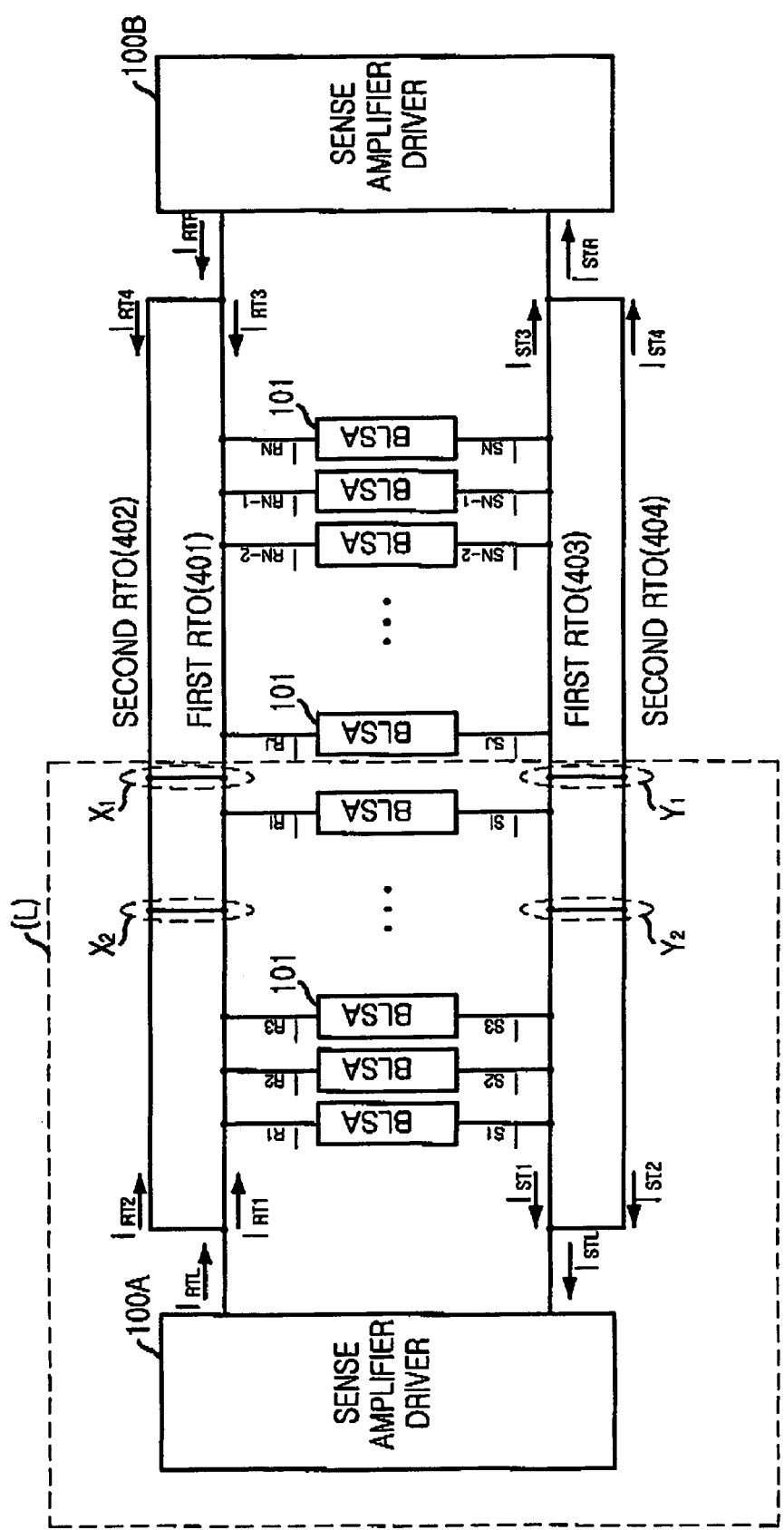
FIG. 4 represents a block diagram showing an arrangement of sense amplifier drivers and bit-line sense amplifiers, and output lines in accordance with an embodiment of the present invention.

FIG. 4 represents a block diagram showing a hierarchical structure of RTO lines and SB lines in a memory device in accordance with a first embodiment of the present invention.

Referring to FIG. 4, there are shown two sense amplifier drivers 100A and 100B connected to the RTO line, used as a pull-up source, and the SB line, used as a pull-down source, and a bit-line sense amplifier array consisting of a plurality of bit-line sense amplifiers 101 located between the two sense amplifier drivers 100A and 100B.

Furthermore, at output nodes of the sense amplifier drivers 100A and 100B, there are formed additional power lines 402 and 404 in addition to the existing RTO line 401 and SB line 403.

That is to say, there are additionally constructed the second RTO line 402 and the second SB line 404 from the output nodes of the sense amplifier driver 100A to those of the sense amplifier driver 100B, and the second RTO line 402 and the second SB line 404 are arranged in parallel with the RTO line 401 and the SB line 403 between the two adjacent sense amplifier drivers 100A and 100B.

Hereinafter, among the output lines of the sense amplifier drivers 100A and 100B, the existing RTO line 401 directly connected to the bit-line sense amplifiers 101 is called a first RTO line and the existing SB line 403 is called a first SB line.

Among the output lines of the sense amplifier drivers 100A and 100B, the additional power line 402 that is not directly connected to the bit-line sense amplifiers 101 and used as the pull-up source, and whose at least one point is strapped with the first RTO line 401 is called a second RTO line.

Among the output lines of the sense amplifier drivers 100A and 100B, the additional power line 404 that is not directly connected to the bit-line sense amplifiers 101 and used as the pull-down source, and whose at least one point is strapped with the first SB line 403 is called a second SB line.

As shown in FIG. 4, the second RTO line 402 is connected to the first RTO line 401 at least one point, e.g., $X_1$ and $X_2$, and it is preferable that one of the connection points is located at a center, e.g., $X_1$, of the bit-line sense amplifier array whose driving force is weakest.

Likewise, the second SB line 404 is attached to the first SB line 403 at least one point, e.g., $Y_1$ and $Y_2$, and it is preferable that one of the connection points is located at a center, e.g., $Y_1$, of the bit-line sense amplifier array whose driving force is weakest.

That is, in accordance with the embodiment of the present invention, by connecting an electric current path having parasitic resistance and parasitic capacitance of the power line itself to the center of the bit-line sense amplifier array, it is possible to prevent the sensing speed reduction and unstable sensing operation of the bit-line sense amplifiers located at the central region of the bit-line sense amplifier array, which have the weakest driving force.

In FIG. 4, there are shown the sense amplifier drivers 100A and 100B located at a left and a right side, which share the RTO line and the SB line.

It is obvious that the present invention is applicable in case the sense amplifier driver is located at one of the left and the right sides.

Hereinafter, the electric current flow described in FIG. 4 is explained. In FIG. 4, there is shown an electric current flow of a bit-line charging and discharging path. This will be explained again with reference to FIG. 8.

An electric current provided to the RTO line which is used as the pull-up source at the output node of the sense amplifier driver 100A at the left side is represented with $I_{RTL}$ (RTO Left) and the $I_{RTL}$ can be divided into $I_{RT1}$ and $I_{RT2}$. The $I_{RT1}$ is an electric current supplied to the first RTO line 401 and the $I_{RT2}$ is an electric current provided to the second RTO line 402.

An electric current provided to the RTO line at the output node of the sense amplifier driver 100B at the right side is represented with $I_{RTR}$ (RTO Right) and the $I_{RTR}$ can be divided into $I_{RT3}$ and $I_{RT4}$. The $I_{RT3}$ is an electric current supplied to the first RTO line 401 and the $I_{RT4}$ is an electric current provided to the second RTO line 402.

An electric current provided from the SB line which is used as the pull-down source at the output node of the sense amplifier driver 100A at the left side is represented with $I_{STL}$ (S Left) and the $I_{STL}$ can be divided into $I_{ST1}$ and $I_{ST2}$. The $I_{ST1}$ is an electric current supplied from the first SB line 403 and the $I_{ST2}$ is an electric current provided from the second SB line 404 to the sense amplifier driver 10A.

An electric current provided from the SB line at the output node of the sense amplifier driver 100B at the right side is represented with $I_{STR}$ (S Right) and the $I_{STR}$ can be divided into $I_{ST3}$ and $I_{ST4}$. The $I_{ST3}$ is an electric current supplied from the first SB line 403 and the $I_{ST4}$ is an electric current provided from the second SB line 404 to the sense amplifier driver 100B.

An electric current supplied to each of the bit-line sense amplifiers 101 is represented with $I_{R1}, I_{R2}, \ldots, R_{Ri}, \ldots, I_{RN-1}, I_{RN}$ and an electric current provided from each of the bit-line sense amplifiers 101 is represented with $I_{S1}, I_{S2}, \ldots, I_{Si}, \ldots, I_{SN-1}, I_{SN}$.

Figure 5:
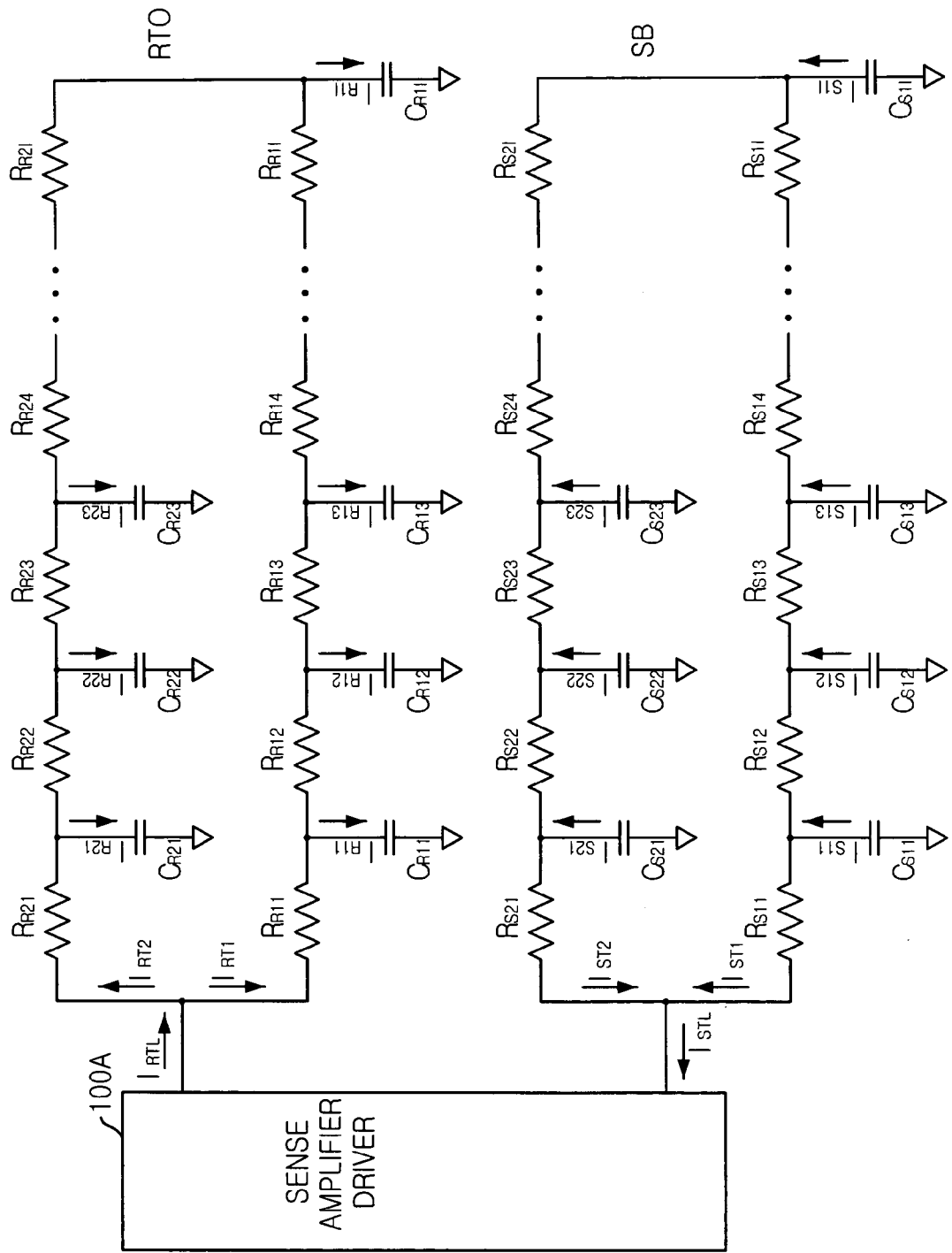
FIG. 5 is a view of modeling a load connected to RTO and SB lines with resistors and capacitors when driving the sense amplifier driver in accordance with an embodiment of the present invention.

A block BB in FIG. 4 is used in the load modeling shown in FIG. 5. Referring to FIG. 5, the load modeling for the block BB is explained.

Figure 3:
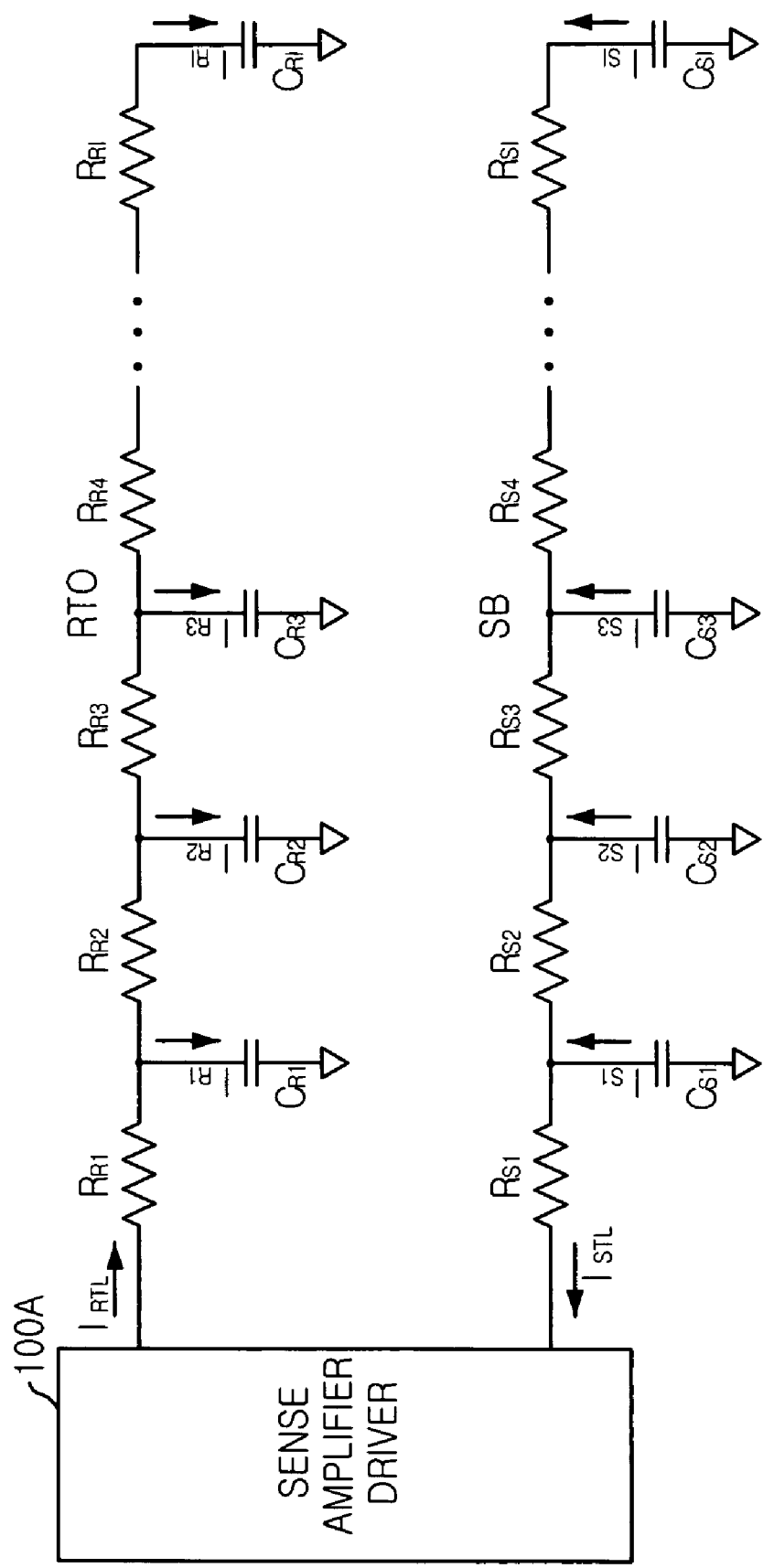
FIG. 3 provides a view of modeling a load connected to RTO and SB lines with resistors and capacitors when driving the conventional sense amplifier driver.

The load modeling in FIG. 5 is a result of modeling all loads constructed at a path from the sense amplifier driver 100A to a memory cell with resistors and capacitors. In accordance with the embodiment of the present invention, since there exist the second RTO line and the second SB line in addition to the first RTO line and the first SB line, a resistor/capacitor model for a new path is added in parallel in addition to the existing load modeling described in FIG. 3.

There will be explained the meaning of additional letters attached to resistance components in FIG. 5.

For instance, for $R_{R21}$, the first additional letter, i.e., R, means that it is related to the RTO line and the second additional letter, i.e., 2, means a newly added power line, i.e., the second RTO line. The third additional letter, i.e., 1, means that a corresponding resistor is the first resistor from the sense amplifier driver 100A at the left side. Likewise, for $C_{S11}$, the first additional letter, i.e., S, means that it is related to the SB line and the second additional letter, i.e., 1, means the existing SB line, i.e., the first SB line. The third additional letter, i.e., 1, means that a corresponding capacitor is the first capacitor from the sense amplifier driver 100A at the left side.

Since the newly added power lines, e.g., the second RTO line and the second SB line, are not directly connected to the bit-line sense amplifier, they have their own parasitic resistance and parasitic capacitance, and the parasitic resistance and the parasitic capacitance are substantially small compared to those of the existing power lines, e.g., the first RTO line and the first SB line.

In the load modeling, a load of the line constructed by the resistors R and the capacitors C is proportional to R×C. Therefore, in case the existing signal line is connected with the newly added signal line in parallel in accordance with the embodiment of the present invention, a time delay is determined by a path having smaller load and, thus, the present invention has a more reduced time delay than the conventional device. Furthermore, since total impedance also becomes smaller, the current driving performance is improved.

Hereinafter, there will be explained detailed circuits of components usable in the present invention with reference to FIGS. 6 to 8.

Figure 6A:
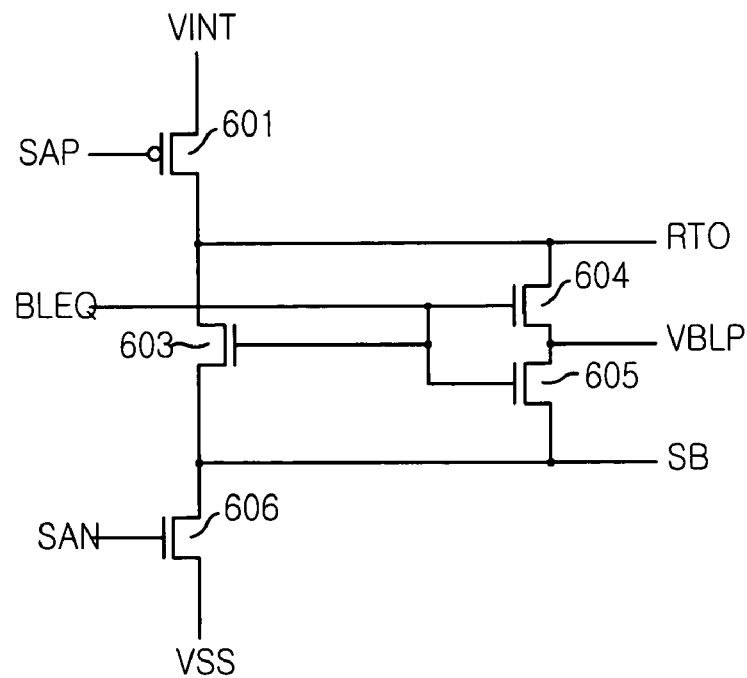
FIG. 6A shows a circuit diagram of a sense amplifier driver in accordance with an embodiment of the present invention.
Figure 6B:
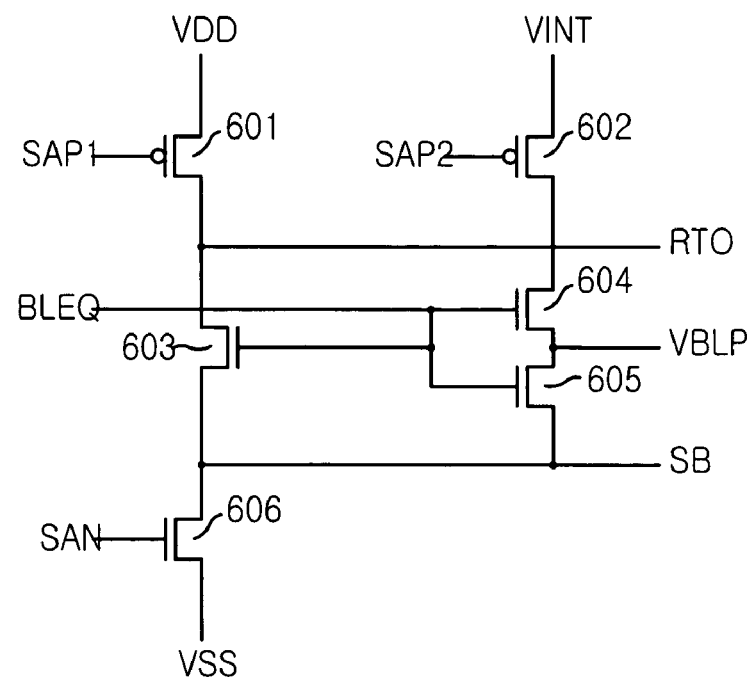
FIG. 6B provides a circuit diagram of a sense amplifier driver in accordance with another embodiment of the present invention.

In FIGS. 6A and 6B, there are shown two different sense amplifier drivers useable in the present invention.

Referring to FIG. 6A, the sense amplifier driver includes a PMOS transistor 601 for receiving a pull-up signal SAP through its gate to thereby provide a power voltage VINT to the RTO line, an NMOS transistor 606 for receiving a pull-down signal SAN through its gate to thereby supply a ground voltage VSS to the SB line, and three NMOS transistors 603, 604 and 605 for pre-charging the RTO line and the SB line with a pre-charge voltage VBLP when the PMOS transistor 601 and the NMOS transistor 606 are inactivated.

Herein, a VDD voltage is an external voltage and called a VCC voltage and the VSS voltage is called the ground voltage. Furthermore, the VINT voltage is a voltage generated at an internal circuit of a DRAM and has a level identical to that of a high data stored in a memory cell. The VBLP voltage is also produced at an internal circuit of the DRAM and has a half level of the VINT voltage.

Then, the sense amplifier driver shown in FIG. 6B is formed from the sense amplifier driver in FIG. 6A to improve an operating speed and further includes a PMOS transistor 602 used as a pull-up device than the sense amplifier driver of FIG. 6A.

Referring to FIG. 6B, the sense amplifier driver contains the PMOS transistor 601 for receiving a first pull-up signal SAP1 through its gate to thereby provide the power voltage VDD to the RTO line, the PMOS transistor 602 for receiving a second pull-up signal SAP2 through its gate to thereby supply the VINT voltage to the RTO line, the NMOS transistor 606 for receiving the pull-down signal SAN through its gate to thereby transfer the ground voltage VSS to the SB line, and the three NMOS transistors 603, 604 and 605 for receiving a BLEQ signal through their gates to thereby pre-charge the RTO line and the SB line with the pre-charge voltage VBLP when the PMOS transistors 601 and 602 and the NMOS transistor 606 are inactivated.

In the sense amplifier driver, in case of a pre-charge state, the pull-up signal SAP has a VDD level and the pull-down signal SAN has a VSS level. Therefore, the PMOS transistor 601, i.e., the pull-up device, and the NMOS transistor 606, i.e., the pull-down device, are both turned-off.

At the pre-charge state, since the BLEQ signal has the VDD level, the NMOS transistors 603, 604 and 605 for pre-charging the RTO line and the SB line are all turned-on and, thus, the RTO line and the SB line are pre-charged with the VBLP voltage.

In the above state, when a word line is activated with a VPP level, the BLEQ signal is falling down to the VSS voltage. After the equalizing and pre-charging state is lifted, data is loaded on a bit line.

If the voltage level of a cell data is sufficiently transferred onto the bit line, the pull-up signal SAP and the pull-down signal SAN are converted to the VSS level and the VDD level, respectively. As a result, the RTO line is converted from the VBLP level to the VINT level and the SB line is converted from the VBLP level to the VSS level to thereby drive a bit-line sense amplifier.

Since the sense amplifier driver in FIG. 6B further includes one more pull-up device compared to that in FIG. 6A, it drives the RTO line with the VDD level, i.e., a higher voltage, by using the PMOS transistor 601 at an early stage of its pull-up operation. Then, after a certain time, it drives the RTO line with the VINT level, i.e., a lower voltage than the VDD voltage, by using the PMOS transistor 602 to thereby improve its operating speed.

Although there are described only two examples of the sense amplifier drivers in FIGS. 6A and 6B, sense amplifier drivers usable in the present invention are not limited to them. Further, the present invention is applicable to any sense amplifier driver using the RTO line as a pull-up source and the SB line as a pull-down source.

Figure 7A:
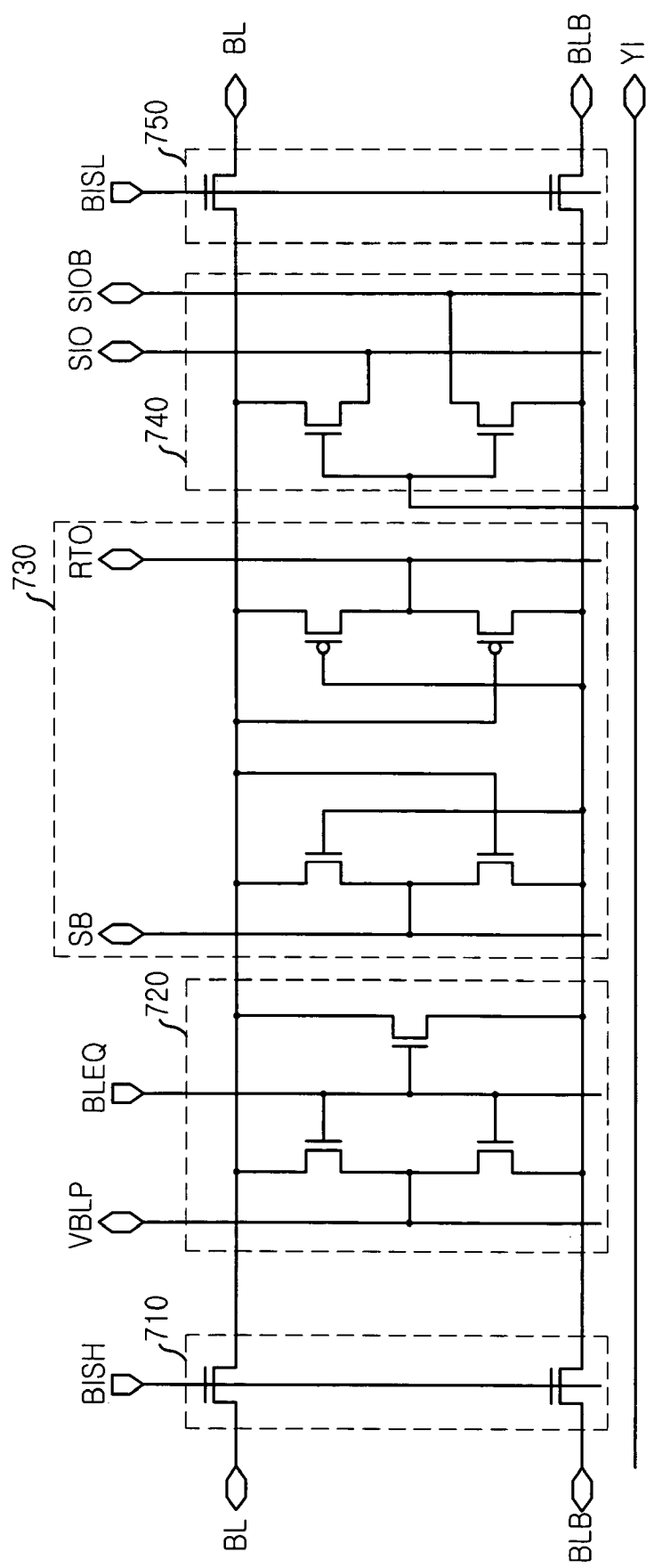
FIG. 7A depicts a circuit diagram of a bit-line amplifier and its peripheral circuits in accordance with an embodiment of the present invention.
Figure 7B:
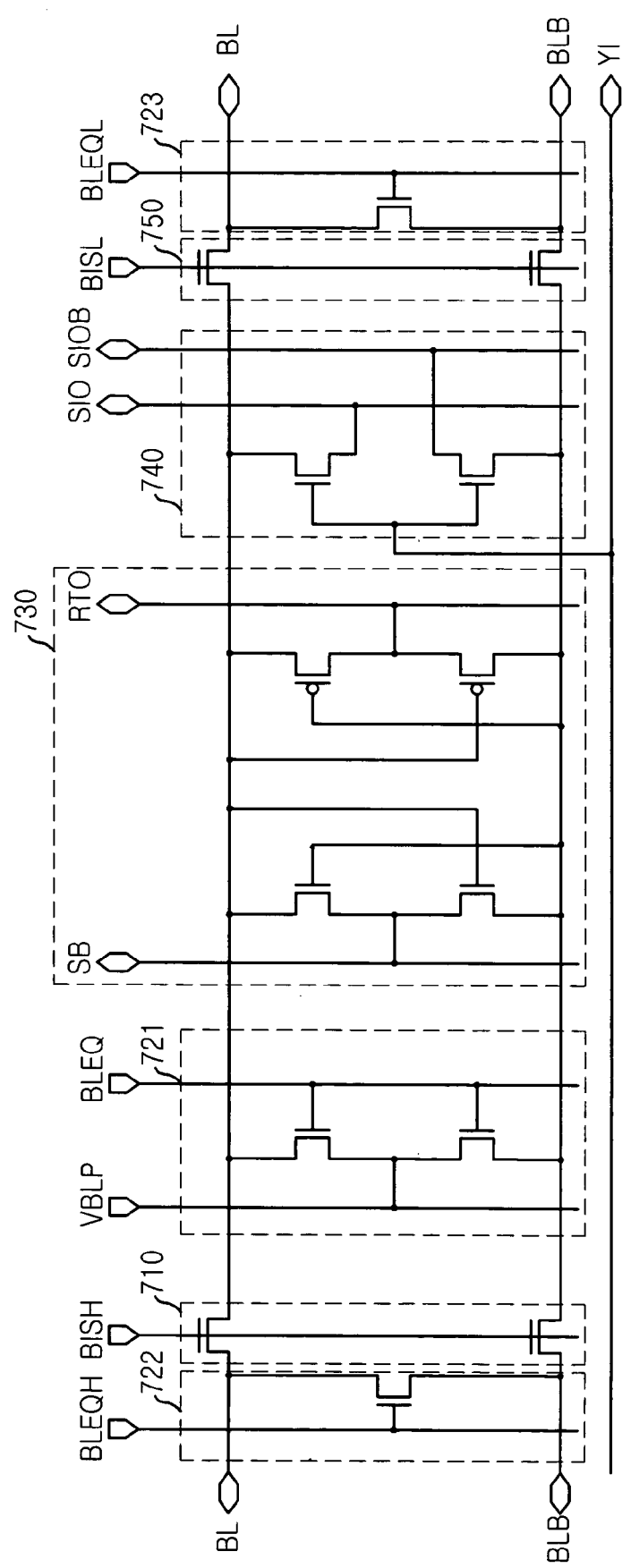
FIG. 7B is a circuit diagram of a bit-line amplifier and its peripheral circuits in accordance with another embodiment of the present invention.

Referring to FIGS. 7A and 7B, there will be explained a bit-line sense amplifier and its peripheral circuits in accordance with embodiments of the present invention.

In FIG. 7A, the bit-line sense amplifier and its peripheral circuits include a first isolation unit 710 for isolating or connecting bit lines of an upper memory cell array block and a bit-line sense amplifier 730 in response to a control signal BISH, an equalizing and pre-charging unit 720 for equalizing and pre-charging the bit lines with a pre-charge voltage having the VBLP level in response to a control signal BLEQ, the bit-line sense amplifier 730 for amplifying data on a positive bit line BL and a negative bit line BLB under the control of RTO and SB signals, a column selecting unit 740 for transferring amplified data outputted from the sense amplifier 730 to segment input/output (I/O) lines SIO and SIOB in response to a column control signal YI, and a second isolation unit 750 for isolating or connecting bit lines of a lower memory cell array block and the bit-line sense amplifier 730 in response to a control signal BISL.

The operation of the bit-line sense amplifier and its peripheral circuits is explained as follows.

At first, since, at a standby state, a word line is at a ground level and the bit-line control signal BLEQ has a high level, the positive bit line BL and the negative bit line BLB are pre-charged with the pre-charge voltage VBLP and the sense amplifier power lines RTO and SB are also pre-charged with the pre-charge voltage VBLP.

Subsequently, if the control signal BLEQ becomes a low level, the bit lines BL and BLB are at a floating state isolated from the outside, maintaining the pre-charge voltage VBLP.

Meanwhile, a row decoder selects one word line by decoding row addresses inputted from the outside and rises up a voltage of the word line to the VPP level. Then, a charge of a memory cell attached to the word line is loaded on the bit line BL and a voltage of the bit line is rising up or falling down according to the data stored at the memory cell.

At this time, the bit-line sense amplifier 730 is enabled by the bit-line sense amplifier control signals RTO and SB and amplifies a voltage difference between the bit lines BL and BLB.

If the voltage difference of the bit lines BL and BLB becomes widen to some degree, the bit-line sense amplifier 730 is disabled by the bit-line sense amplifier control signals RTO and SB and, thus, the sense amplifying operation is terminated. The cell data amplified by the bit-line sense amplifier 730 is outputted to the segment I/O lines SIO and SIOB under the control of the column control signal YI.

Referring to FIG. 7B, the bit-line sense amplifier and its peripheral circuits include an upper block equalizing unit 722 for equalizing bit lines of an upper memory cell array block in response to a control signal BLEQH, a first isolation unit 710 for isolating or connecting the bit lines of the upper memory cell array block and a bit-line sense amplifier 730 in response to a control signal BISH, a pre-charging unit 721 for pre-charging the bit lines with a pre-charge voltage having the VBLP level in response to a control signal BLEQ, the bit-line sense amplifier 730 for amplifying data on a positive bit line BL and a negative bit line BLB under the control of RTO and SB signals, a column selecting unit 740 for transferring amplified data outputted from the sense amplifier 730 to segment I/O lines SIO and SIOB in response to a column control signal YI, a second isolation unit 750 for isolating or connecting bit lines of a lower memory cell array block and the bit-line sense amplifier 730 in response to a control signal BISL, and a lower block equalizing unit 723 for equalizing the bit lines of the lower memory cell array block in response to a control signal BLEQL.

In order to improve a pre-charge speed $t_{RP}$, the circuit described in FIG. 7B has a structure of separately constructing the pre-charging unit 721, the upper block equalizing unit 722 for equalizing the bit lines of the upper memory cell array block and the lower block equalizing unit 723 for equalizing the bit lines of the lower memory cell array block by modifying the equalizing and pre-charging unit 720 shown in FIG. 7A.

Since the bit-line sense amplifier and its peripheral circuits shown in FIGS. 7A and 7B are examples of the present invention, other circuits having difference structures from the above are also applicable to the present invention.

Figure 8A:
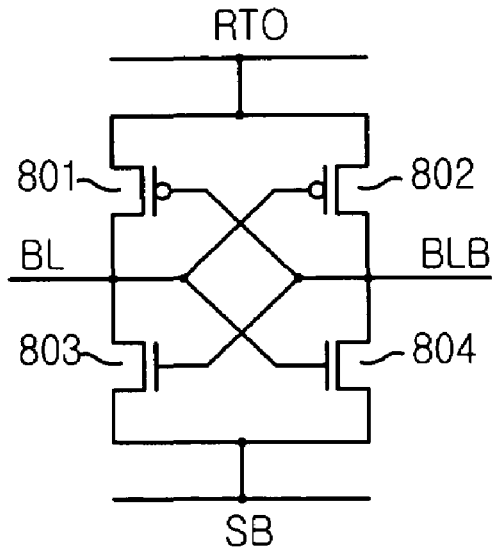
FIGS. 8A and 8B show a structure of a bit-line amplifier and its electric current flow in accordance with embodiments of the present invention, respectively.

Referring to FIG. 8A, there will be explained a circuit structure and operation of a bit-line sense amplifier in accordance with an embodiment of the present invention.

The bit-line sense amplifier in FIG. 8A has a cross-coupled NMOS transistors 803 and 804 and PMOS transistors 801 and 802 operating according to driving voltages RTO and SB. There are connected a positive bit line BL between the first PMOS transistor 801 and the first NMOS transistor 803 and a negative bit line BLB between the second PMOS transistor 802 and the second NMOS transistor 804.

In FIG. 8A, if the RTO line used as a pull-up source changes from a pre-charge level to the VINT level and the SB line used as a pull-down source varies from the pre-charge level to the VSS level, the bit-line sense amplifier starts the sensing operation and amplifies a voltage difference between the positive bit line BL and the negative bit line BLB.

Figure 8B:
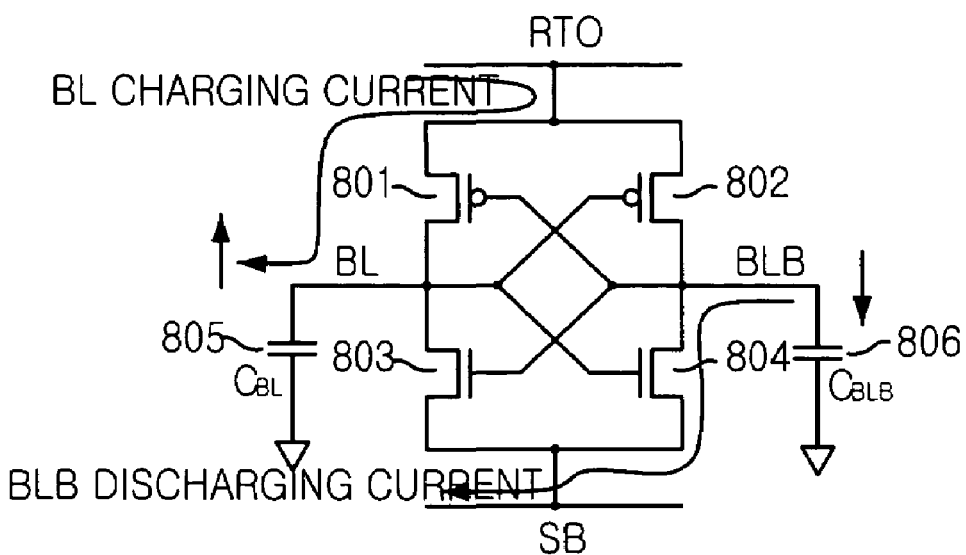

At this time, the positive bit line BL is charged with the VINT level by an electric current provided from the RTO line and the negative bit line BLB is charged with the VSS level by a voltage level of the SB line. An electric current flow occurring at the bit-line sense amplifier is represented in FIG. 8B.

Figure 9:
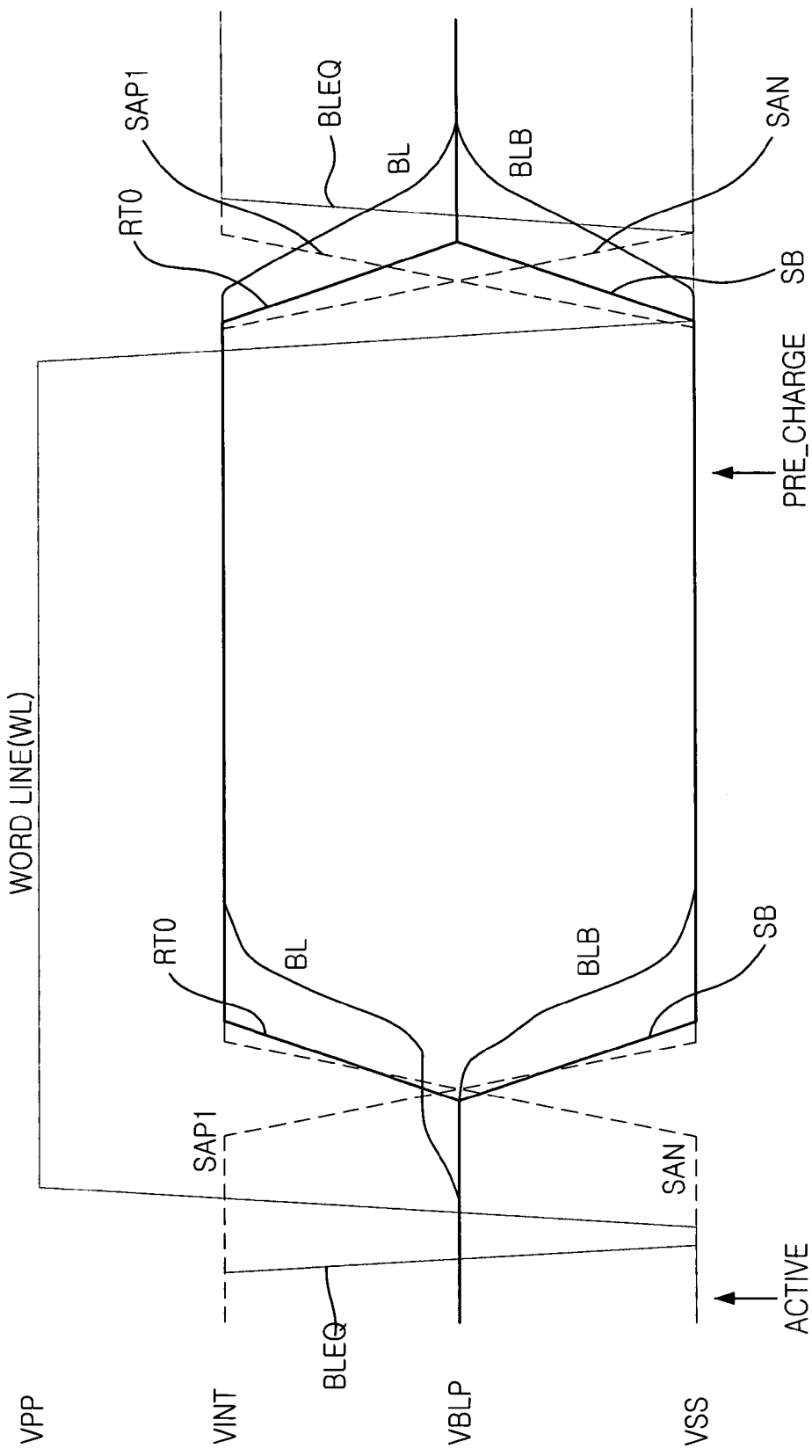
FIG. 9 presents a waveform diagram of signals used in the operation of a memory device in accordance with an embodiment of the present invention.

FIG. 9 presents a waveform diagram of signals used in the operation of a memory device, especially, a sense amplifier driver and a bit-line sense amplifier, in accordance with an embodiment of the present invention.

Referring to FIG. 9, since, in a pre-charge state, the BLEQ signal is activated, the pull-up signal SAP1 and the pull-down signal SAN of the sense amplifier driver have the VINT level and the VSS level, respectively, both of the RTO line and the SB line are pre-charged with the pre-charge voltage VBLP.

At this state, if the word line is activated to the VPP level and the BLEQ signal is falling down to the VSS level, the cell data is loaded onto the bit line after the bit line equalizing and pre-charging state is lifted.

If the voltage level of the cell data is sufficiently transferred onto the bit line, the pull-up signal SAP1 and the pull-down signal SAN are converted to the VSS level and the VDD level, respectively. As a result, the RTO signal is converted from the pre-charge level VBLP to the VINT level and the SB signal is converted from the pre-charge level VBLP to the VSS level to thereby make the bit-line sense amplifier starting its sensing operation.

Through the sensing operation of the bit-line sense amplifier, the voltage difference of the positive bit line BL and the negative bit line BLB is amplified and transferred to the segment I/O lines SIO and SIOB.

After the above sensing operation is terminated, the word line level is going back to the pre-charge state to prepare the next sensing operation. That is, the word line voltage is falling down to the VSS level. The pull-up signal SAP1 is converted from the VSS level to the VINT level and the pull-down signal SAN is changed from the VINT level to the VSS level. As a result, the RTO line and the SB line are pre-charged with the VBLP level.

Figure 10:
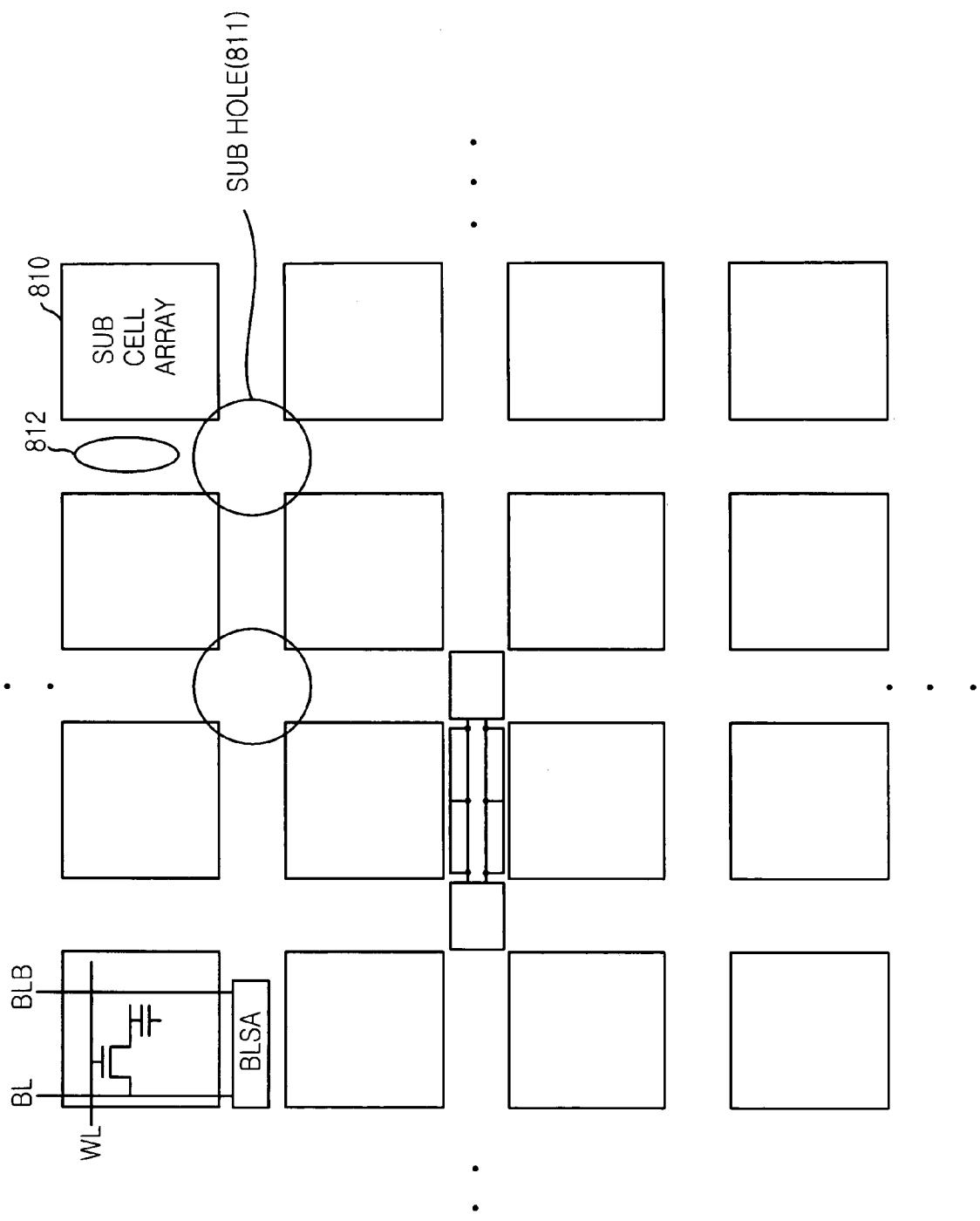
FIG. 10 represents a view showing an arrangement of sense amplifier drivers of a memory device in accordance with an embodiment of the present invention.

FIG. 10 represents a view showing an arrangement of sense amplifier drivers of a memory device in accordance with an embodiment of the present invention. In FIG. 10, there is described a rectangular sub cell array 810.

In a region, e.g., 812, between two adjacent sub cell arrays, there are disposed sub word line drivers (not shown). A region where four sub cell arrays are crossed is called a sub hole or a cross hole, e.g., 811. In the sub hole 811, there is arranged a sense amplifier driver in accordance with the embodiment of the present invention.

Referring to FIG. 10, the sense amplifier drivers located at the left sub hole and the right sub hole of the sub cell array 810 share a RTO line and a SB line.

However, according to a type of the memory device or an intention of a designer, the adjacent sense amplifier drivers might not share the RTO line and the SB line. The present invention is also applicable to that case.

Figure 11:
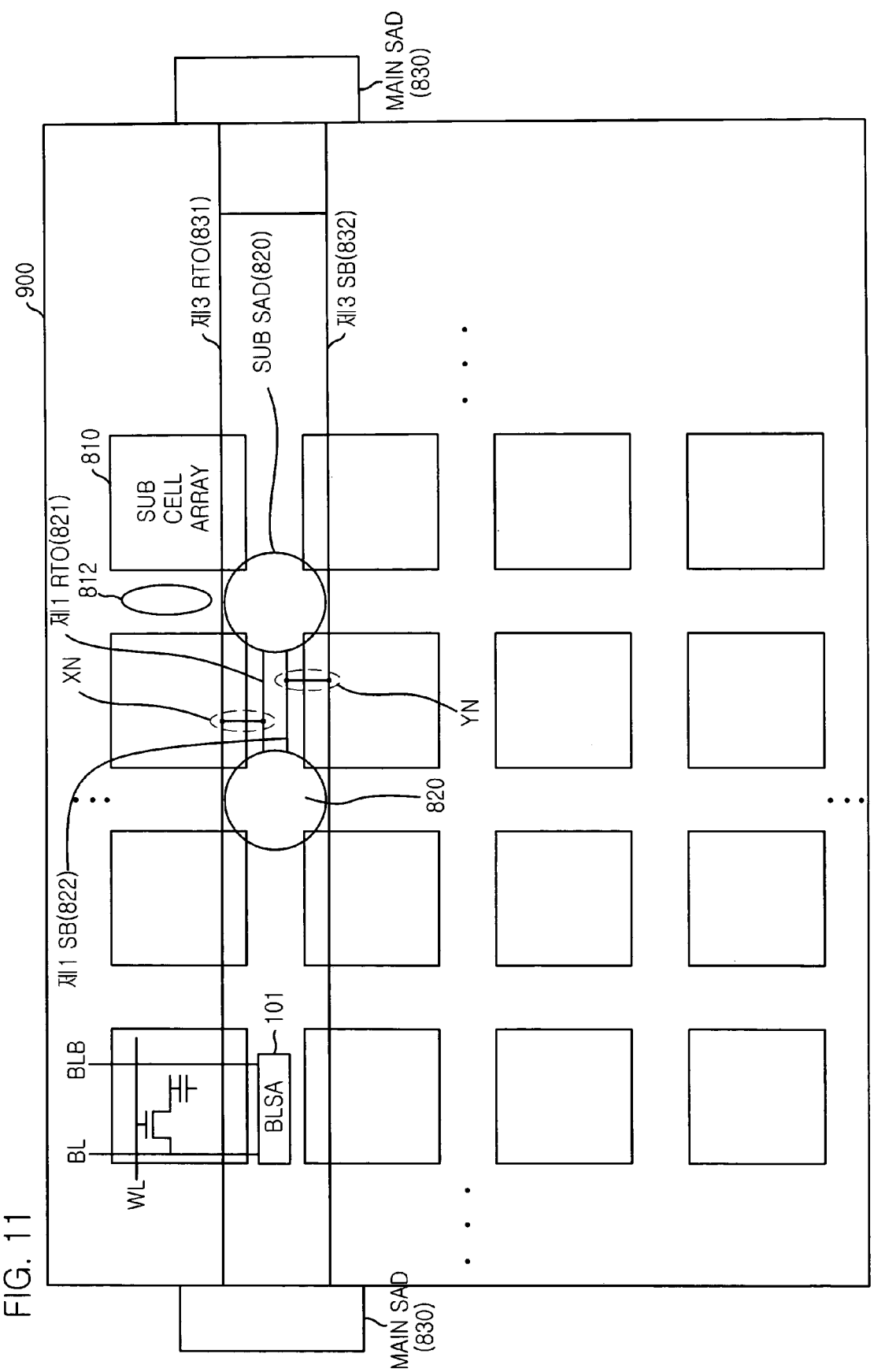
FIG. 11 describes a view showing an arrangement of main sense amplifier drivers and their sub sense amplifier drivers of a memory device in accordance with an embodiment of the present invention.

FIG. 11 describes a memory device employing hierarchical RTO lines and SB lines in accordance with an embodiment of the present invention.

In a bank or a memory cell block 900, there is provided a structure of further employing a main sense amplifier driver 830 at both edges of the bank, forming additional power lines from a third RTO line 831 and a third SB line 832 which are output lines of the main sense amplifier driver 830, and directly connecting the additional power lines to an existing RTO line and SB line where the driving force of the sense amplifier driver is weakest.

Figure 1:
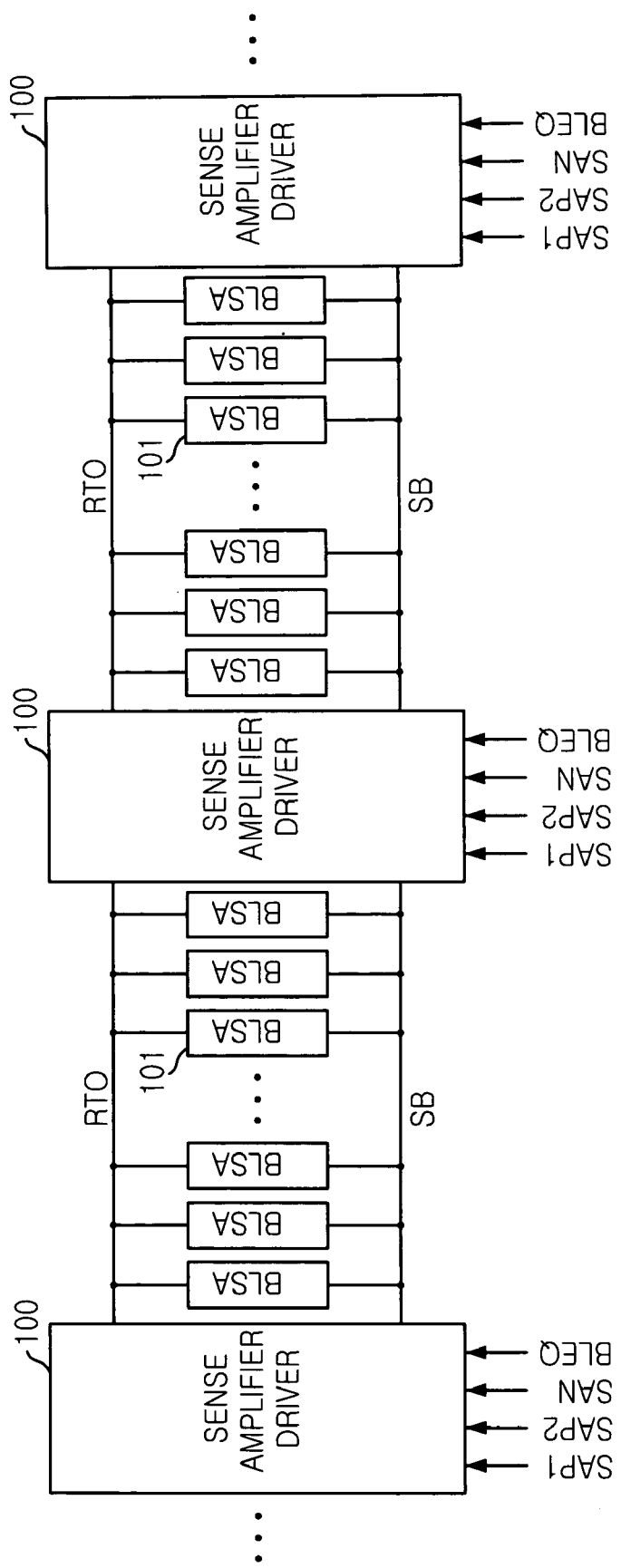
FIG. 1 is a block diagram showing an arrangement of sense amplifier drivers and bit-line sense amplifiers, and output lines of a conventional memory device.
Figure 2:
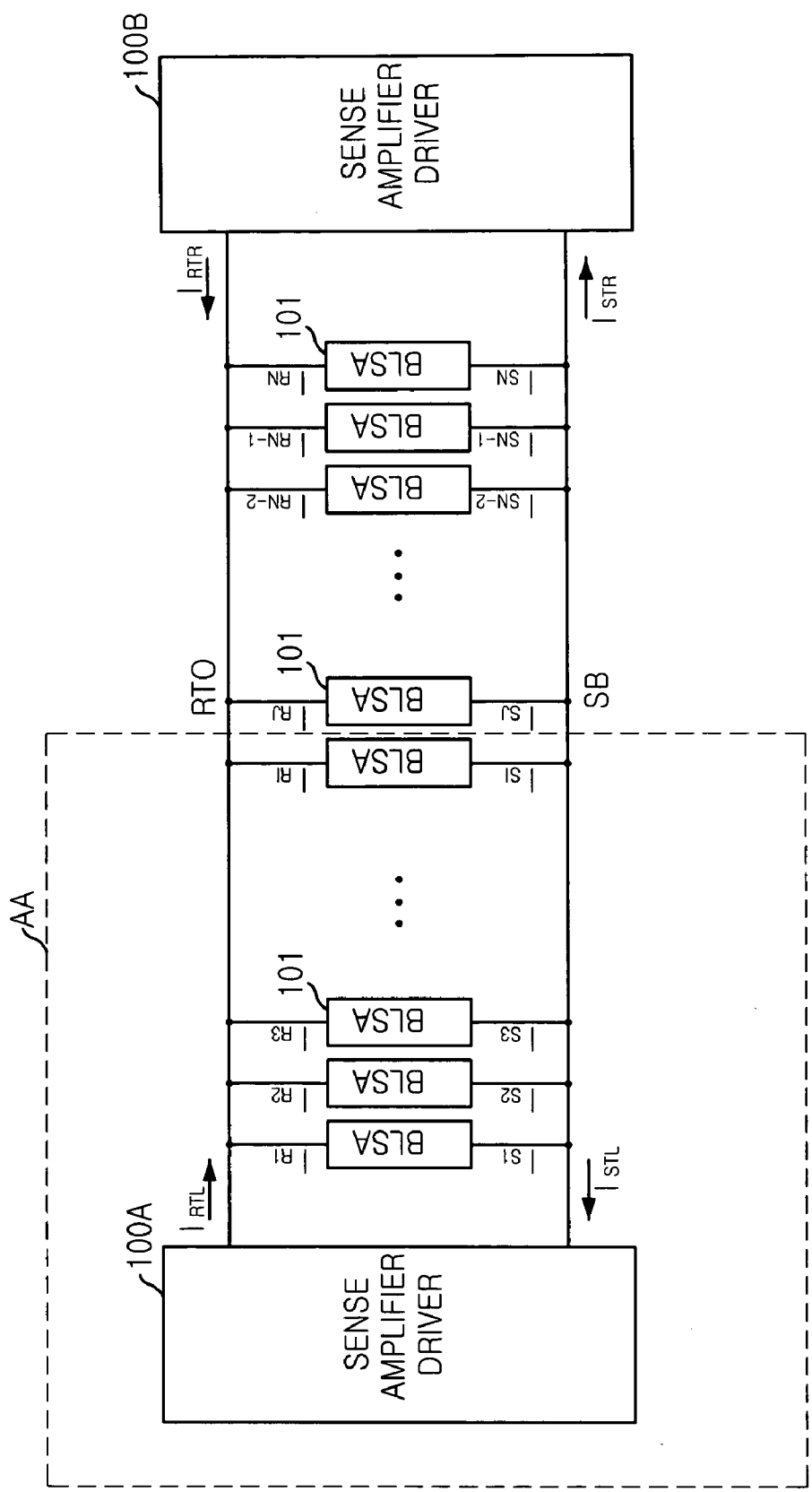
FIG. 2 shows an electric current flow when driving the conventional sense amplifier driver.

That is to say, the line connection between the sub sense amplifier driver 820 shown in FIG. 11 and a bit-line sense amplifier array (not shown) is identical to that of the conventional memory device described in FIG. 1. The sub sense amplifier driver 820 is located at the sub hole described in FIG. 10. Furthermore, there are shown a first RTO line 821 and a first SB line 822 which are output lines of the sub sense amplifier driver 820.

The main sense amplifier drivers 830 located at the left and the right edges of the bank 900 provide their outputs onto the third RTO line 831 and the third SB line 832. Since the third RTO line 831 and the third SB line 832 are not directly connected to the bit-line sense amplifier, it is possible to perform the modeling for the lines with a load having parasitic resistance and parasitic capacitance of the lines.

As described above, since the third RTO line 831 used as a pull-up source is connected to the first RTO line 821 at a central region of a bit-line sense amplifier array where driving force is weak, i.e., a connection point $X_n$ in FIG. 11, it is possible to enhance a sensing speed of the bit-line sense amplifier.

Likewise, since the third SB line 832 used as a pull-down source is also attached to the first SB line 822 at the central region of the bit-line sense amplifier array where driving force is weak, i.e., a connection point $Y_n$ in FIG. 11, it is possible to enhance a driving force of the bit-line sense amplifier.

With reference to the above embodiments of the present invention, although there is shown the structure of two sense amplifier drivers sharing the RTO line and the SB line, the present invention is applicable to a structure of the RTO line and the SB line connected to only one sense amplifier driver.

In accordance with the present invention, it is possible to improve the driving force of the sense amplifier driver of the semiconductor device, thereby enhancing the sensing speed of the bit-line sense amplifier. In addition, by uniformly improving the driving force of the sense amplifier driver, there is implemented a stable sensing operation of the bit-line sense amplifier.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device comprising:
   a sense amplifier array unit including a plurality of bit-line sense amplifiers arrayed to each other;
   a first driver, located at one side of the sense amplifier array unit, for generating a driving voltage of the plurality of bit-line sense amplifiers;
   a second driver, located at the other side of the sense amplifier array unit, for producing the driving voltage of the plurality of bit-line sense amplifiers;
   a first power line, which is connected between an output node of the first driver and that of the second driver, and to which a driving voltage input node of each of the plurality of bit-line sense amplifiers is attached in parallel; and
   a second power line, connected to the first power line in parallel between the output node of the first driver and that of the second driver, and strapped with the first power line at least one point.

2. The semiconductor memory device as recited in claim 1, wherein the strapping of the first power line and the second power line is implemented at a central region of the sense amplifier array unit.

3. A semiconductor memory device comprising:
   a sense amplifier array unit including a plurality of bit-line sense amplifiers arrayed to each other, wherein each of the plurality of bit-line sense amplifiers has a first driving voltage input node being a pull-up source and a second driving voltage input node being a pull-down source of bit lines;
   a first driver, located at one side of the sense amplifier array unit, for generating a first and a second driving voltage of the plurality of bit-line sense amplifiers;
   a second driver, located at the other side of the sense amplifier array unit, for producing the first and the second driving voltages of the plurality of bit-line sense amplifiers;
   a first power line, which is connected between a first driving voltage output node of the first driver and that of the second driver, and to which a first driving voltage input node of each of the plurality of bit-line sense amplifiers is attached in parallel;
   a second power line, connected to the first power line in parallel between the first driving voltage output node of the first driver and that of the second driver, and strapped with the first power line at least one point;
   a third power line, which is connected between a second driving voltage output node of the first driver and that of the second driver, and to which a second driving voltage input node of said each of the plurality of bit-line sense amplifiers is attached in parallel; and
   a fourth power line, connected to the third power line in parallel between the second driving voltage output node of the first driver and that of the second driver, and strapped with the third power line at least one point.

4. The semiconductor memory device as recited in claim 3, wherein the strapping of the third power line and the fourth power line is implemented at a central region of the sense amplifier array unit.

5. The semiconductor memory device as recited in claim 3, wherein each of the first driver or the second driver includes:
   a pull-up means for providing an internally generated voltage to the first driving voltage output node under the control of a control signal;
   a pull-down means for pulling down the second driving voltage output node to a ground level by simultaneously actuated with the pull-up means; and
   a pre-charging means for pre-charging the first driving voltage output node and the second driving voltage output node with a pre-charge voltage when the pull-up means and the pull-down means are inactivated.

6. The semiconductor memory device as recited in claim 5, wherein the pull-up means is constructed with a PMOS transistor and the pull-down means is formed with an NMOS transistor.

7. The semiconductor memory device as recited in claim 3, wherein each of the first driver or the second driver includes:
   a first pull-up means for supplying an external voltage to the first driving voltage output node under the control of a first control signal;
   a second pull-up means for providing an internally generated voltage to the first driving voltage output node in response to a second control signal;
   a pull-down means for pulling down the second driving voltage output node to a ground level by simultaneously actuated with the first pull-up means; and
   a pre-charging means for pre-charging the first driving voltage output node and the second driving voltage output node with a pre-charge voltage when the first and the second pull-up means and the pull-down means are inactivated.

8. The semiconductor memory device as recited in claim 7, wherein the first and the second pull-up means are constructed with PMOS transistors and the pull-down means is formed with an NMOS transistor.

9. The semiconductor memory device as recited in claim 7, wherein the internally generated voltage has a voltage level identical to that of a high data stored at a memory cell.

10. A semiconductor memory device comprising:
    a sense amplifier array unit including a plurality of bit-line sense amplifiers arrayed to each other, wherein each bit-line sense amplifier has a first driving voltage input node being a pull-up source and a second driving voltage input node being a pull-down source of bit-lines;
    a first driver, located at one side of the sense amplifier array unit, for generating a first and a second driving voltage of the plurality of bit-line sense amplifiers;

a second driver, located at the other side of the sense amplifier array unit, for producing the first and the second driving voltages of the plurality of bit-line sense amplifiers;

a third driver, located at one side of a memory cell block, for generating the first and the second driving voltages of the plurality of bit-line sense amplifiers;

a fourth driver, located at the other side of the memory cell block, for producing the first and the second driving voltages of the plurality of bit-line sense amplifiers;

a first power line, which is connected between a first driving voltage output node of the first driver and that of the second driver, and to which a first driving voltage input node of each of the plurality of bit-line sense amplifiers is attached in parallel;

a second power line, connected to the first power line in parallel between a first driving voltage output node of the third driver and that of the fourth driver, and strapped with the first power line at least one point;

a third power line, which is connected between a second driving voltage output node of the first driver and that of the second driver, and to which a second driving voltage input node of said each of the plurality of bit-line sense amplifiers is attached in parallel; and a fourth power line, connected to the third power line in parallel between a second driving voltage output node of the third driver and that of the fourth driver, and strapped with the third power line at least one point.

11. The semiconductor memory device as recited in claim 10, wherein each of the first to the fourth drivers includes:

a pull-up means for providing an internally generated voltage to the first driving voltage output node under the control of a control signal;

a pull-down means for pulling down the second driving voltage output node to a ground level as simultaneously actuated with the pull-up means; and a pre-charging means for pre-charging the first driving voltage output node and the second driving voltage output node with a pre-charge voltage when the pull-up means and the pull-down means are inactivated.

12. The semiconductor memory device as recited in claim 10, wherein each of the first to the fourth drivers includes:

a first pull-up means for supplying an external voltage to the first driving voltage output node under the control of a first control signal;

a second pull-up means for providing an internally generated voltage to the first driving voltage output node in response to a second control signal;

a pull-down means for pulling down the second driving voltage output node to a ground level as simultaneously actuated with the first pull-up means; and a pre-charging means for pre-charging the first driving voltage output node and the second driving voltage output node with a pre-charge voltage when the first and the second pull-up means and the pull-down means are inactivated.

13. A semiconductor memory device comprising:

a sense amplifier array unit including a plurality of bit-line sense amplifiers arrayed to each other;

a driver, located at one side of the sense amplifier array unit, for generating a driving voltage of the plurality of bit-line sense amplifiers;

a first power line connected to an output node of the driver for supplying the driving voltage to each input node of the plurality of bit-line sense amplifiers is attached in parallel; and a second power line, connected to the first power line in parallel at the output node of the driver, and strapped with the first power line at least one point.

14. A semiconductor memory device comprising:

a sense amplifier array unit including a plurality of bit-line sense amplifiers arrayed to each other, wherein each bit-line sense amplifier has a first driving voltage input node being a pull-up source and a second driving voltage input node being a pull-down source of bit lines;

a driver, located at one side of the sense amplifier array unit, for generating a first and a second driving voltage of the plurality of bit-line sense amplifiers;

a first power line connected to a first driving voltage output node of the driver for supplying the first driving voltage to a first input node of each of the plurality of bit-line sense amplifiers is attached in parallel;

a second power line, connected to the driving voltage output node of the driver, and strapped with the first power line at least one point;

a third power line, which is connected to a second driving voltage output node of the driver for supplying the second driving voltage to a second input node of said each of the plurality of bit-line sense amplifiers is attached in parallel; and a fourth power line, connected to the second driving voltage output node of the driver, and strapped with the third power line at least one point.

* * * * *